United States Patent [19]

Hoffert

[11] Patent Number: 4,707,668

[45] Date of Patent: Nov. 17, 1987

[54] METHOD AND APPARATUS FOR TRANSFERRING AND INJECTING RF ENERGY FROM A GENERATOR TO A RESONANT LOAD

[75] Inventor: William J. Hoffert, Albuquerque, N. Mex.

[73] Assignee: The United States of America as represented by the Department of Energy, Washington, D.C.

[21] Appl. No.: 859,949

[22] Filed: May 5, 1986

[51] Int. Cl.$^4$ .............................................. H03F 3/60
[52] U.S. Cl. ..................................... 330/56; 333/227; 333/246
[58] Field of Search ...................... 330/53, 56, 124 R; 333/246, 227

[56] References Cited

PUBLICATIONS

Knadle, "A Strip-Line Kilowatt Amplifier for 432 MHz", QST, Apr. 1972, pp. 49-55, 330-356.

Primary Examiner—James B. Mullins
Attorney, Agent, or Firm—Ray G. Wilson; Judson R. Hightower

[57] ABSTRACT

Improved apparatus and method are provided for the coherent amplification and injection of radio-frequency (rf) energy into a load cavity using a plurality of amplifier tubes. A plurality of strip line cavities (30, 32, 34, 36, 40, 42, 44) are laterally joined to define a continuous closed cavity (48), with an amplifier tube (50, 52, 54, 56, 58, 60, 62, 64) mounted within each resonant strip cavity. Rf energy is injected into the continuous cavity (48) from a single input (70) for coherent coupling to all of the amplifier tubes for amplification and injection into the load cavity (76).

11 Claims, 4 Drawing Figures

METHOD AND APPARATUS FOR TRANSFERRING AND INJECTING RF ENERGY FROM A GENERATOR TO A RESONANT LOAD

BACKGROUND OF THE INVENTION

This invention relates to a method and apparatus for amplifying radio-frequency (rf) energy for injecting into an adjacent load, and more particularly, to a method and apparatus for coherent rf injection with a plurality of amplifier tubes. This invention is the result of a contract with the Department of Energy (Contract No. W-7405-ENG-36).

It is frequently necessary to use a plurality of amplifiers which operate in parallel to deliver an output signal with the desired strength to a resonant cavity. In such cases the parallel amplifiers might be located remote from the resonant cavity, where the output from the amplifiers is combined for transmission to the resonant cavity. In other instances, amplifier assemblies are mounted in parallel on the resonant cavity for directly injecting the amplified signals within the cavity.

Where the amplifiers are remotely located, it will be appreciated that the delivered power can be affected by transmission losses. It will also be noted that the transmission line characteristics can change with age and with ambient conditions with resulting changes in line impedance, signal phase change, resonant frequencies, etc. For direct mounting of amplifiers about a resonant cavity, independent coaxial input cavities are conventionally used with amplifier tubes and must be individually mounted and driven about the load. A substantial amount of ancillary equipment is required to monitor and to maintain the amplifier outputs in coherent phase relationships.

Accordingly, it is an objective of the present invention to directly couple rf input and output to a resonant load.

It is another object of the present invention to minimize ancillary equipment in maintaining coherent phase relationships between parallel amplifiers.

One other object of the present invention is to simplify the installation of a plurality of amplifier tubes about a resonant load.

Another object of the present invention is to maintain input-output impedance matching over a wide range of circuit conditions.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise an amplifier for transferring radio-frequency (rf) energy to an adjacent load cavity. An input strip line resonator defines a continuous input cavity for receiving the rf driving energy. A plurality of amplifier tubes are mounted in the input cavity for use in coherently amplifying the rf energy transmitted through the continuous cavity. A load cavity is then provided adjacent the strip line resonator for receiving rf energy amplified by the amplifier tubes.

In another characterization of the present invention, an amplifier is provided for transferring rf energy to an adjacent load cavity, including a plurality of strip line resonators which are laterally joined to define a continuous closed cavity. The strip line resonators enclose a volume which approximates a cylindrical resonator as a load cavity. An amplifier tube is mounted within each of the strip line resonator members. Rf energy injection means are provided within one of the strip resonators for injecting rf energy within the continuous closed cavity for transfer to the plurality of amplifier tubes. Each amplifier tube further includes a loop output means for coupling outputs from the amplifier tubes to the cylindrical load cavity.

In one other characterization of the present invention a method is provided for the coherent transfer of rf energy to an adjacent load cavity. A plurality of strip lines resonators are joined to define a continuous closed cavity with a corresponding amplifier tube mounted on each of the strip line resonators. Rf energy is injected into the continuous closed cavity from a single location on the plurality of strip line resonators. Amplified rf output energy is coupled from each of the tubes to the load cavity.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE PREFERRED EMBODIMENTS

Figure 1:
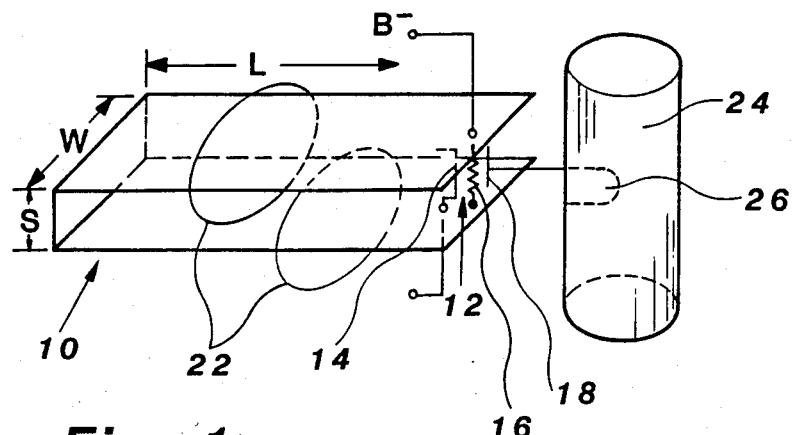
FIG. 1 is a simplified schematic illustrating various concepts of the present invention.

In order to achieve the objects and advantages of the present invention a strip line resonator is used to replace a conventional coaxial cavity for inputting rf power to an amplifier tube for injection into an adjacent load cavity. FIG. 1 depicts strip line resonator 10 with amplifier tube 12 mounted therein. The characteristic impedance of strip line 10 is a linear function of the cavity height, S, and an inverse function of line width, W. Thus, it may be shown that the characteristic impedance is $Z_O = 377 (S/W)$.

The impedance at any point along the strip line 10 is $Z = Z_O \tan L$, where "L" is the length distance from a reference null point, or shorted end. Thus, tube 12 can be located along strip line 10 to optimize impedance matching therebetween. The resonant frequency of strip line 10 is determined solely by the dimension "L", such that an optimum set of dimensions can be derived for the desired frequency and impedance matching.

Where a single strip line 10 feeds a single amplifier tube 12, magnetic flux lines 22 encircle the strip line elements for coupling into tube 12. As shown in FIG. 1, tube 12 includes cathode 14 and grid 16 which are negatively biased and plate 18 which is coupled into resonant cavity 24. Energy transfer loop 26 is sized to provide a matched load for plate 18, further considering the geometry of load cavity 24, as explained below.

Only a single tube 12 is depicted in FIG. 1 mounted within strip line resonator 10. Where additional energy amplification requirements exit, it is possible to mount a plurality of tubes 12 within strip line resonator 10. When amplifier tubes 12 are mounted in parallel, the input impedance of the parallel tubes is inversely proportional to the number of tubes, i.e., $Z_n = Z/n$ for "n" tubes.

A strip line resonator advantageously has an output impedance which varies inversely as the width, W, of the resonator. By increasing the width, W, of strip line resonator 10 by the same factor as the number of parallel tubes 12, the output impedance of strip line 10 is reduced by the same factor, $1/n$, as the input impedance of the plurality of parallel amplifier tubes 12. Thus, it will be appreciated that a plurality of amplifier tubes 12 may be mounted in a single strip line resonator 10 and fed from a single input cavity to obtain coherent outputs 26 into an adjacent load cavity. Impedance matching is maintained by increasing the width, W, of strip line resonator 10 for optimum energy transfer.

Figure 2:
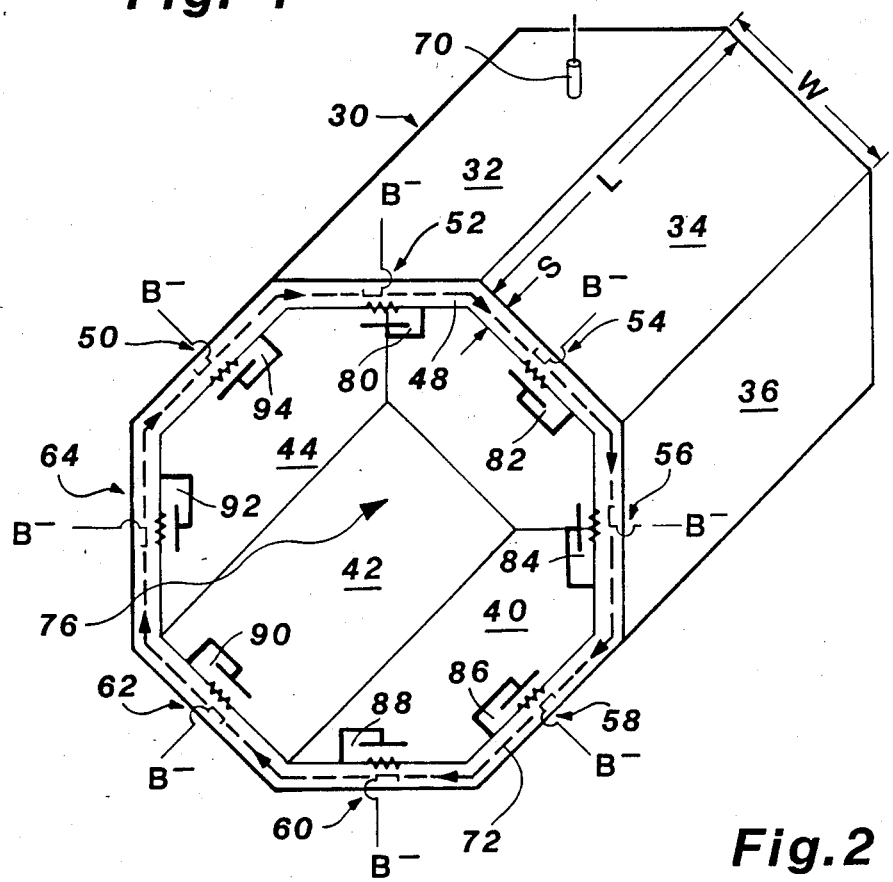
FIG. 2 is a pictorial illustration of one embodiment of the present invention.

Referring now to FIG. 2, there is shown a preferred embodiment of the present invention where a strip line resonator has been configured to form a closed cavity 76 which may approximate a cylindrical cavity. For illustrative purposes an 8-sided figure is depicted, although more or fewer sides could be employed to form the enclosed cavity 76. In another description of the embodiment depicted in FIG. 2, a plurality of strip line resonators 30, 32, 34, 36, 38, 40, 42, and 44 are laterally joined to form a continuous internal cavity 48 enclosing load cavity 76, which is substantially cylindrical. Then, spacing, S, of continuous cavity 48 and the width, W, of a single resonator defines an impedance for matching with selected individual amplifier tubes 50, 52, 54, 56, 58, 60, 62, and 64.

It will be appreciated that the structure shown in FIG. 2 may further include a mirror image of the strip line resonators about the amplifier tubes for optimum rf performance. In either event, a single rf input 70 provides an input through continuous cavity 48 to tubes 50, 52, 54, 56, 58, 60, 62, and 64 forming a coherent closed driving field 72, within cavity 48 and about cylindrical cavity 76, to drive the amplifier tubes.

Each amplifier tube 50, 52, 54, 56, 58, 60, 62, 64 is loaded with a loop 80, 82, 84, 86, 88, 90, 92, 94, respectively, which is sized to provide impedance matching for optimum energy transfer.

One advantageous result from the apparatus hereinabove described is operational stability even with failure of an input amplifier tube. As shown below, if one of the "n" tubes has failed, and a loop is lost feeding load cavity 76, the impedance of each of the remaining loops would be reduced by a factor $(n-1)/n$. With the remaining $(n-1)$ tubes delivering the same power as "n" tubes, the power output of each tube must increase by $(n/n-1)$. Thus, the tubes are driven to slightly higher grid voltage and plate currents, but, because of the reduced load impedance, the plate voltage at the higher power changes very little. Under these conditions, the output impedance of the tube drops nearly the same ratio $(n-1)/n$, to maintain a substantially normal impedance match. These conclusions are shown are follows:
Let:
  $A_L$ = Loop Area
  $A_c = \frac{1}{2}$ cavity cross-sectional area
  $R_s$ = Cavity shunt resistance
  $Z_n$ = Loop impedance (also equals tube output impedance)
Then:

$$A_L = A_c(Z_n/R_s)^{\frac{1}{2}} \tag{1}$$

For "n" inputs:

$$A_n = \text{Area per loop with "}n\text{" inputs} \tag{2}$$
$$= A_L/(n)^{\frac{1}{2}} = A_c(Z_n/nR_s)^{\frac{1}{2}}$$

$$Z_n = n(A_n/A_c)^2 R_s \tag{3}$$

If there are only $(n-1)$ inputs, then:

$$Z_{n-1} = \text{new impedance of input loops} \tag{4}$$
$$= (n-1)(A_n/A_c)^2 R_s$$

Dividing equation (3) by (4) and solving for $Z_{n-1}$:

$$Z_{n-1} = Z_n[(n-1)/n] \tag{5}$$

Equation (5) indicates that, when the number of inputs change from "n" to $(n-1)$, the impedance of each loop drops by a corresponding factor of $(n-1)/n$.

To determine the impact of a tube failure on input voltages and currents in the coupling loops when the number of inputs changes from "n" loops to $(n-1)$ loops let:
  $P_n$ = Power input per loop with "n" inputs.
  $P(n-1)$ = Power input per loop with $(n-1)$ inputs.
  $E_n$ = Voltage at loop with "n" inputs.
  $E(n-1)$ = Voltage at loop with $(n-1)$ inputs.
  $I_n$ = Loop current with "n" inputs.
  $I(n-1)$ = Loop current with $(n-1)$ inputs.
Then:

$$P_n = E_n^2/Z_o \text{ or } E_n = (P_n Z_o)^{\frac{1}{2}} \tag{6}$$

With only $(n-1)$ inputs, the power input to each loop must be increased by the ratio $n/(n-1)$ to maintain total power input. As shown above, each input loop impedance has also decreased by the ratio $(n-1)/n$:

$$\frac{n}{n-1} P_n = \frac{E_{n-1}^2}{\frac{n-1}{n} Z_o} \text{ or} \tag{7}$$

$$E_{n-1} = \left[ \frac{n}{n-1} P_n \times \frac{n-1}{n} Z_o \right]^{\frac{1}{2}}$$
$$= [P_n Z_o]^{\frac{1}{2}}$$

From (6) and (7), it is apparent that $E_n = E_{n-1}$, i.e., the voltage input to each loop does not change on loss of an amplifier tube.

To determine the current relationships, let:

$$P_n = I_n^2 Z_n$$

$$P_{n-1} = I_{n-1}^2 Z_{n-1}$$

It has been shown that:

$$P_{n-1} = n/n - 1 P_n$$

$$Z_{n-1} = n - 1/n Z_n$$

Substituting:

$$I_{n-1} = \left[ \frac{\frac{n}{n-1} P_n}{\frac{n-1}{n} Z_n} \right]^{\frac{1}{2}} = \frac{n}{n-1} \left[ \frac{P_n}{Z_n} \right]^{\frac{1}{2}} \quad (8)$$

$$= \frac{n}{n-1} I_n$$

Thus, a tube failure produces an increased current in the remaining tubes by a factor $n/(n-1)$.

By way of further illustration, assume an assembly having ten (10) inputs with a failure of one tube, leaving nine (9) inputs. Each of the remaining tubes would have an increased power output of 10/9, or a factor of 1.11, to maintain full power to the load. The input impedance of each remaining loop is decreased by a ratio of 9/10, or by a factor of 0.9. The corresponding voltage input at each loop is unchanged, but the current is increased by a ratio of 10/9, or a factor of 1.11.

Operating parameters for the tubes were calculated for the condition of normal power and for a power increase of 1.11. For increased power, it was assumed that the drive power would increase by a factor of 1.11 and that the grid voltage swing would increase by $\sqrt{1.11}$, or a factor of 1.054. The load line was shifted to maintain the plate voltage swing, a requirement shown from equations (6) and (7). With increased power output, a load line analysis shows plate current increasing by a factor of 1.13 and output impedance decreasing by a factor of 1.12, generally shown by the previous analysis. A power increase of 1.13 is indicated.

As further shown by a load line analysis, the increased cathode current results in a decrease in input impedance from 25 to 23 ohms. The parallel input impedance of ten tubes is 2.5 and is 2.55 for nine tubes. Thus, tube operating parameters before and after a loss of one amplifier maintain a good input to output match for generally normal system power delivery.

Figure 3A:
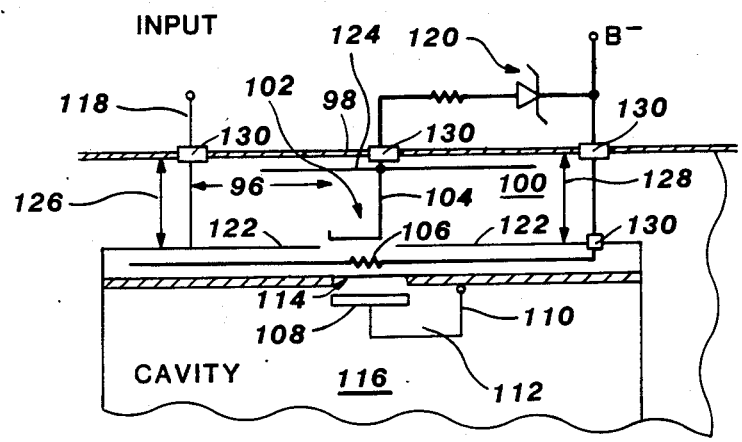
FIG. 3A is a simplified cross section of one embodiment of the present invention.
Figure 3B:
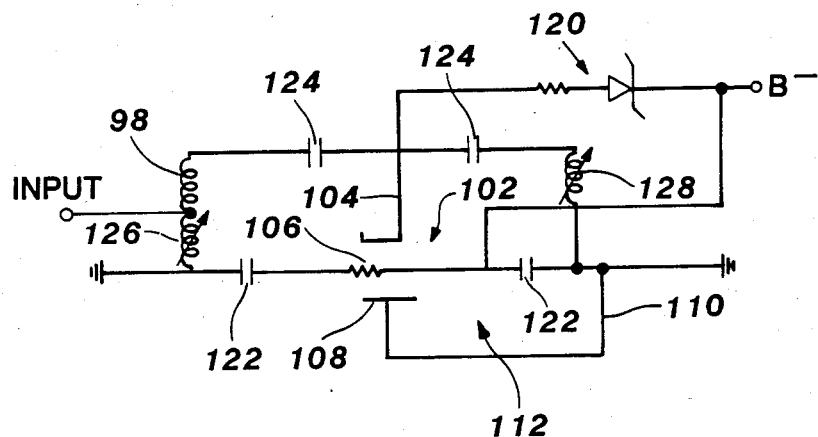
FIG. 3B is a schematic of the equivalent electrical circuit of the embodiment shown in FIG. 3A.

One further advantage of an rf energy amplifier and injection system according to the present invention is that a substantially unitary structure may be formed as depicted in FIGS. 3A and 3B. Strip line resonator 98 defines rf input cavity 100. Strip line resonator 98 encloses load cavity 116 for direct power transfer within load cavity 116. Amplifier tube 102 is mounted within strip line 98 through mounting aperture 114, with cathode 104, a heated filament (not shown), a grid 106, and plate 108 vacuum sealed in a housing (not shown). As shown in FIG. 3, plate 108 is directly connected to loop 110 defining loop area 112 for transferring power within load cavity 116.

As explained above, strip line resonator 98 includes a plurality of tubes 102. Rf input antenna 118 is shown within strip line resonator 98 and power is coherently coupled through a single cavity 100 to amplifier tubes 102 spaced a fixed distance 96 from antenna 118. FIG. 3 pictorially indicates that output leads from input antenna 118, cathode 104, and grid 106 emerge through insulators 130 in resonator 98. External circuit components 120 connect with cathode 104 and grid 106 to properly bias tube 102 for transferring energy from input 118 to within cavity 116. Tuning of the rf amplifier and injection system of FIG. 3 is obtained with tuning elements 126 and 128, which may be plates forming slidable shorting elements to change the effective length of cavity 100 for impedance matching. The unitary structure coherently transmits and amplifies rf energy from input 118 for transfer from continuous cavity 100 through loops 112 to within load cavity 116. As shown above, the resulting unitary structure maintains generally uniform operating parameters even with internal failures.

Power tubes 102 may be selected from a variety of triode tubes having suitable power output and operating characteristics. By way of example, the following tubes are believed to be suitable:

| Manufacturer | Model Number |
| --- | --- |
| Machlett Lab. | ML-8539 |
| Eimac | 8940 |
| Eimac | 8941/Y690 |
| Eimac | 3CX800U7 |

Power tubes 102 are conventionally mounted within strip line resonator 98 and adjacent load cavity 116.

The operation of the structure shown in FIG. 3B may be better understood by further reference to the equivalent electrical circuit shown schematically in FIG. 3B. Tuning is provided by capacitive coupling 124 from cathode 104 to resonator 98 and adjustable tuning elements 126, 128 within resonator 98. Tuning elements 126, 128 enable tuning of strip line 98 for impedance matching with tube 102 and adjusting the input coupling ratio for maximum transfer of input energy from input 118 to tubes 102. Grid by-pass plate 122 is provided beyond the location of tuning elements 126, 128 and returns to ground outside strip line section 98. Thus, grid voltage may be applied from a feed point outside the rf fields for more efficient operation and stability.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An amplifier for transferring rf energy to an adjacent load, comprising:
    an input strip line resonator defining a continuous input cavity forming a closed path for receiving said rf energy;
    a plurality of amplifier tubes mounted in said input cavity for coherently amplifying said rf energy transmitted through said continuous cavity;
    said strip line resonator having a width effective to obtain an output impedance to match an input impedance of said plurality of amplifier tubes; and
    a load cavity within said closed path defined by said strip line resonator for receiving said amplified rf energy.

2. An amplifier according to claim 1, wherein said closed path approximates a cylinder.

3. An amplifier according to claim 2, wherein said closed path is formed from a plurality of laterally joined strip line resonators.

4. An amplifier according to claim 3, wherein each one of said plurality of strip line resonators has an output impedance to match an input impedance of one of said plurality of amplifier tubes mounted on said one strip line resonator.

5. An amplifier for transferring rf energy to an adjacent load comprising:
   a plurality of strip line resonators laterally joined to define a continuous closed cavity and enclosing a volume approximating a cylindrical cavity as a load;
   an amplifier tube mounted within each of said strip line resonators;
   rf energy injection means within one of said strip line resonators for injecting rf energy within said continuous closed cavity for transfer to said plurality of amplifier tubes; and
   loop output means for coupling outputs from said amplifier tubes to said cylindrical cavity load.

6. An amplifier according to claim 5, wherein each said strip line resonator has an output impedance matching an input impedance of said amplifier tube mounted thereon.

7. An amplifier according to claim 5, wherein each said amplifier tube is integrally formed with a corresponding strip line resonator.

8. An amplifier according to claim 5, wherein said plurality of strip line resonators, said amplifiers tubes and said cavity load define a substantially unitary structure.

9. A method for the coherent transfer of rf energy to a cavity load, comprising:
   joining a plurality of strip line resonators to define a continuous closed cavity and further defining said cavity load;
   mounting a corresponding amplifier tube on each of said strip line resonators;
   injecting rf energy into said continuous closed cavity from a single location on said plurality of strip line resonators; and
   coupling amplifier rf output energy from each said tube to said cavity load.

10. An energy transfer method according to claim 9, including the step of:
    defining said cavity load within said joined plurality of strip line resonators to be a resonant load.

11. An energy transfer method according to claim 10, including the step of:
    matching an output impedance of each one of said plurality of strip line resonators with an input impedance of said corresponding amplifier tube.

* * * * *